(12) United States Patent
Senn

(10) Patent No.: US 9,966,290 B2
(45) Date of Patent: May 8, 2018

(54) SYSTEM AND METHOD FOR WAFER ALIGNMENT AND CENTERING WITH CCD CAMERA AND ROBOT

(71) Applicant: Lam Research Corporation, Fremont, CA (US)

(72) Inventor: Brandon Senn, Molalla, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 237 days.

(21) Appl. No.: 14/813,895

(22) Filed: Jul. 30, 2015

(65) Prior Publication Data

US 2017/0028560 A1 Feb. 2, 2017

(51) Int. Cl.
- *H01L 21/68* (2006.01)
- *G06T 7/00* (2017.01)
- *G06T 7/73* (2017.01)
- *H01L 21/67* (2006.01)

(52) U.S. Cl.
CPC .......... *H01L 21/681* (2013.01); *G06T 7/0004* (2013.01); *G06T 7/73* (2017.01); *H01L 21/67201* (2013.01); *H01L 21/682* (2013.01); *G06T 2207/30148* (2013.01); *Y10S 901/02* (2013.01); *Y10S 901/47* (2013.01)

(58) Field of Classification Search
CPC ............. H01L 21/681; H01L 21/67201; H01L 21/682; G06T 7/73; G06T 7/0004; G06T 2207/30148; Y10S 901/47; Y10S 901/02

See application file for complete search history.

(56) References Cited

U.S. PATENT DOCUMENTS

| | | |
|---|---|---|
| 4,055,376 A | 10/1977 | Daberko |
| 4,819,167 A | 4/1989 | Cheng et al. |
| 4,971,443 A | 11/1990 | Koyagi |
| 5,530,548 A | 6/1996 | Campbell et al. |
| 5,546,179 A | 8/1996 | Cheng |
| 5,675,407 A | 10/1997 | Geng |
| 5,822,213 A | 10/1998 | Huynh |

(Continued)

FOREIGN PATENT DOCUMENTS

| | | |
|---|---|---|
| CA | 2305919 A1 | 10/2000 |
| EP | 0462596 A1 | 12/1991 |

(Continued)

OTHER PUBLICATIONS

"International Preliminary Report on Patentability", Issued in PCT Application No. PCT/US2008/087556; dated Jul. 8, 2010, 4 pages.

(Continued)

*Primary Examiner* — Darrin Dunn
*Assistant Examiner* — Marzia T Monty

(57) ABSTRACT

A wafer alignment system includes an image capture module that captures an image of a wafer positioned on a robot. An image analysis module analyzes the image to determine a position of the wafer on the robot. A position correction module calculates adjustment data based on the determined position of the wafer on the robot. A system control module controls the robot to at least one of place the wafer and retrieve the wafer based on the calculated adjustment data and a nominal position of the wafer on the robot.

20 Claims, 7 Drawing Sheets

(56) References Cited

U.S. PATENT DOCUMENTS

| | | | |
|---|---|---|---|
| 5,905,850 A * | 5/1999 | Kaveh | H01L 21/67259 |
| | | | 198/394 |
| 5,999,268 A | 12/1999 | Yonezawa et al. | |
| 6,094,264 A | 7/2000 | Wuyts | |
| 6,114,705 A | 9/2000 | Leavitt et al. | |
| 6,126,382 A | 10/2000 | Scales et al. | |
| 6,188,323 B1 | 2/2001 | Rosenquist et al. | |
| 6,191,851 B1 | 2/2001 | Kirkham et al. | |
| 6,195,619 B1 | 2/2001 | Ren | |
| 6,339,730 B1 | 1/2002 | Matsushima | |
| 6,409,463 B1 | 6/2002 | Croft et al. | |
| 6,502,054 B1 | 12/2002 | Mooring et al. | |
| 6,629,053 B1 | 9/2003 | Mooring | |
| 6,747,746 B2 | 6/2004 | Chizhov et al. | |
| 6,847,730 B1 | 1/2005 | Beer et al. | |
| 6,895,831 B2 | 5/2005 | Hunter | |
| 6,917,698 B2 | 7/2005 | Obi | |
| 6,952,255 B2 | 10/2005 | Perry et al. | |
| 7,158,280 B2 | 1/2007 | Sandstrom | |
| 7,197,828 B2 | 4/2007 | Lof et al. | |
| 7,227,628 B1 | 6/2007 | Sullivan et al. | |
| 7,352,440 B2 | 4/2008 | Hoogendam et al. | |
| 7,417,724 B1 | 8/2008 | Sullivan et al. | |
| 8,099,192 B2 | 1/2012 | Genetti et al. | |
| 8,755,935 B2 | 6/2014 | Douki et al. | |
| 8,860,955 B2 | 10/2014 | Rodnick et al. | |
| 8,954,287 B2 | 2/2015 | Rodnick et al. | |
| 2002/0068992 A1 | 6/2002 | Hine et al. | |
| 2003/0231950 A1 | 12/2003 | Raaijmakers | |
| 2004/0151574 A1 * | 8/2004 | Lu | H01L 21/681 |
| | | | 414/816 |
| 2004/0167743 A1 | 8/2004 | Hosek | |
| 2004/0258514 A1 | 12/2004 | Raaijmakers | |
| 2005/0102064 A1 | 5/2005 | Donoso et al. | |
| 2005/0137751 A1 | 6/2005 | Cox et al. | |
| 2005/0276920 A1 | 12/2005 | Kim | |
| 2006/0009047 A1 | 1/2006 | Wirth et al. | |
| 2006/0045666 A1 | 3/2006 | Harris et al. | |
| 2006/0100740 A1 | 5/2006 | Sakiya et al. | |
| 2006/0167583 A1 | 7/2006 | Sundar | |
| 2007/0095791 A1 | 5/2007 | Shinozaki et al. | |
| 2007/0112465 A1 | 5/2007 | Sadighi et al. | |
| 2007/0177963 A1 | 8/2007 | Tang et al. | |
| 2008/0061255 A1 | 3/2008 | Park | |
| 2008/0068618 A1 | 3/2008 | Kagami | |
| 2008/0071408 A1 | 3/2008 | Hiroki | |
| 2009/0070065 A1 * | 3/2009 | Seko | G01B 11/26 |
| | | | 702/152 |
| 2010/0272347 A1 | 10/2010 | Rodnick et al. | |
| 2012/0271590 A1 | 10/2012 | Sakhare et al. | |
| 2013/0056635 A1 | 3/2013 | Kimba et al. | |
| 2013/0287536 A1 | 10/2013 | Koelmel | |
| 2013/0330848 A1 | 12/2013 | Minato et al. | |
| 2014/0207284 A1 | 7/2014 | Kiley et al. | |

FOREIGN PATENT DOCUMENTS

| | | |
|---|---|---|
| EP | 1175970 A2 | 1/2002 |
| EP | 1669808 A2 | 6/2006 |
| JP | 2000-114347 A | 4/2000 |
| JP | 2001-210692 A | 8/2001 |
| JP | 2001-230302 A | 8/2001 |
| JP | 2002-313872 A | 10/2002 |
| JP | 2002-540388 A | 11/2002 |
| JP | 2004-050306 A | 2/2004 |
| JP | 2004-080001 A | 3/2004 |
| JP | 2004-288792 A | 10/2004 |
| JP | 2005-068502 A | 3/2005 |
| JP | 2007-501527 A | 1/2007 |
| JP | 2007-037967 A | 2/2007 |
| JP | 2007-324486 A | 12/2007 |
| JP | 2008-251968 A | 10/2008 |
| KR | 2005-0010849 A | 1/2005 |
| KR | 2005-0087361 A | 8/2005 |
| WO | WO-97-37376 A1 | 10/1997 |
| WO | WO-99-02996 A2 | 1/1999 |
| WO | WO-0057127 A1 | 9/2000 |
| WO | WO-0178114 A1 | 10/2001 |
| WO | WO-03087436 A1 | 10/2003 |
| WO | WO-2004-086465 A2 | 10/2004 |
| WO | WO-2005-028994 A2 | 3/2005 |
| WO | WO-2005-037495 A1 | 4/2005 |

OTHER PUBLICATIONS

"International Search Report", Issued in PCT Application No. PCT/US2008/087556; dated Aug. 7, 2009.
"Written Opinion", Issued in PCT Application No. PCT/US2008/087556; dated Aug. 7, 2009.
"International Search Report", Issued in PCT Application No. PCT/US2008/087684; dated Jul. 29, 2009.
"Written Opinion", Issued in PCT Application No. PCT/US2008/087684; dated Jul. 29, 2009.
"International Preliminary Report on Patentability", Issued in PCT Application No. PCT/US2008/087684; dated Jul. 8, 2010.
"International Search Report", Issued in PCT Application No. PCT/US2008/087775; dated Aug. 5, 2009.
"Written Opinion", Issued in PCT Application No. PCT/US2008/087775; dated Aug. 5, 2009.
"International Preliminary Report on Patentability", Issued in PCT Application No. PCT/US2008/087775, dated Jul. 8, 2010.
"International Search Report", Issued in PCT Application No. PCT/US2008/087578; dated Aug. 5, 2009.
"Written Opinion", Issued in PCT Application No. PCT/US2008/087578; dated Aug. 5, 2009.
"International Preliminary Report on Patentability", Issued in PCT Application No. PCT/US2008/087578; dated Jul. 8, 2010.

* cited by examiner

SYSTEM AND METHOD FOR WAFER ALIGNMENT AND CENTERING WITH CCD CAMERA AND ROBOT

FIELD

The present disclosure relates to substrate processing systems, and more particularly to systems and methods for positioning a semiconductor wafer in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes. A substrate may be arranged on a substrate support, such as a pedestal in a processing chamber of the substrate processing system. For example only, during etching, a gas mixture including one or more precursors is introduced into the processing chamber and plasma is struck to etch the substrate.

A load lock (e.g., an inbound or outbound load lock) or other transfer tool may be used to transfer semiconductor wafers from an atmospheric environment to a vacuum environment (i.e., from outside of the processing chamber into the processing chamber), or vice versa. The load lock itself may include a vacuum chamber containing a pedestal. The wafer is arranged on (and transferred to and from) the pedestal. For example, the wafer may be transferred from the pedestal to a plating or other process cell of a processing chamber in the substrate processing system for deposition, etching, etc. The pedestal lifts the wafer onto and off of a robot (e.g., an end effector of the robot) used to transfer the wafer between the load lock and the process cell.

SUMMARY

A wafer alignment system includes an image capture module that captures an image of a wafer positioned on a robot. An image analysis module analyzes the image to determine a position of the wafer on the robot. A position correction module calculates adjustment data based on the determined position of the wafer on the robot. A system control module controls the robot to at least one of place the wafer and retrieve the wafer based on the calculated adjustment data and a nominal position of the wafer on the robot.

A wafer alignment method includes capturing an image of a wafer positioned on a robot, analyzing the image to determine a position of the wafer on the robot, calculating adjustment data based on the determined position of the wafer on the robot, and controlling the robot to at least one of place the wafer and retrieve the wafer based on the calculated adjustment data and a nominal position of the wafer on the robot.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
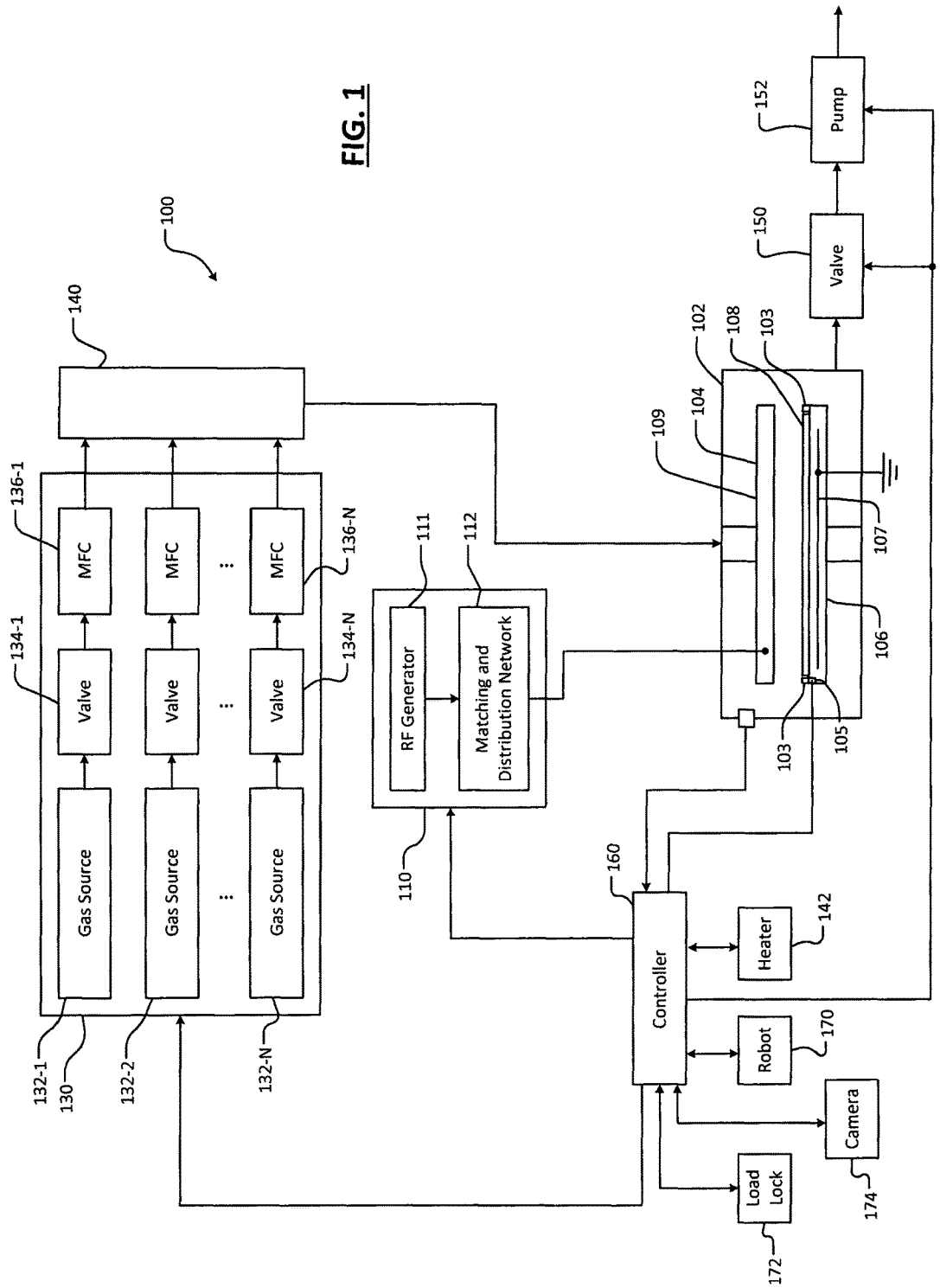
FIG. 1 is a functional block diagram of an example substrate processing system according to the principles of the present disclosure.

A semiconductor wafer (e.g., a 300 mm wafer) is positioned on a pedestal of a load lock to be transferred into and out of a processing chamber. The wafer is aligned on the pedestal to allow accurate capture and/or transfer of the wafer (e.g., to a process cell) using a robot or other tool. Alignment of the wafer may be achieved using a notch formed in an outer edge of the wafer. Various types of wafer aligners may be used to detect a position of the notch as the wafer is rotated. For example, a sensor may detect the notch as the wafer is slowly rotated using the chuck. A notch location and wafer offset are calculated based on the detected notch and provided to the robot.

Wafer alignment systems and methods according to the principles of the present disclosure implement an image capture device (e.g., a camera such as a high-resolution charge-coupled device, or CCD, camera array) arranged above a path of a wafer. The camera captures an image of the wafer being transferred to and/or from a pedestal by a robot. Although descriptions herein refer to a pedestal of a load lock, the principles of the present disclosure may be implemented using any wafer drop-off location within a substrate processing system. For example, the camera may capture the image in response to (i.e., the camera may be triggered by) the robot reaching a predetermined position relative to the pedestal. For example, the captured image may correspond to a bitmap image. An image analysis module analyzes the captured image to determine a position (e.g., position and orientation, such as a rotational position) of the wafer relative to the robot (e.g., to an end effector of the robot). As used herein, the "position" of the wafer includes both lateral displacement of the wafer (e.g., displacement of a center of the wafer) and rotational displacement of the wafer (e.g., rotation of the wafer on an axis defined by the center of the wafer).

The determined position may then be compared to a desired or nominal position of the wafer. For example, the robot may include one or more reference markings for determining the position of the wafer relative to the robot. The system may also store nominal position data indicative of the nominal position (e.g., a position of a previously captured image of a wafer in the nominal position). For example, a surface of the robot supporting the wafer may include a partial outline (e.g., of a perimeter of the wafer) or other reference markings indicating the nominal position. The image analysis module may compare the determined position of the captured image to the reference markings and/or the nominal position data to calculate a position adjustment (i.e., corresponding to a position error, or difference between the determined position and the nominal position).

The robot transfers the wafer to the pedestal. If the position adjustment is less than a threshold (e.g., an error threshold), the system may continue directly to a next wafer processing step (e.g., transferring the wafer from the pedestal to a process cell). If the error is greater than the threshold, the robot is controlled to adjust the position of the wafer based on the position adjustment. The position of the robot (e.g., orientation of the robot relative to the pedestal) may be adjusted according to the calculated adjustment. For example, the position of the robot may be adjusted prior to the robot retrieving the wafer from the pedestal and then subsequently transferring the wafer back to the pedestal, and/or adjusted subsequent to the robot wafer retrieving the wafer from the pedestal but prior to transferring the wafer back to the pedestal. In other words, the position of the robot itself can be adjusted one or both of prior to and subsequent to retrieving the wafer from the pedestal, according to the calculated adjustment, so that replacing the wafer on the pedestal achieves a desired position. In examples, if the calculated adjustment is above a threshold (e.g., an offset and/or rotational distance), the robot can be controlled to retrieve and replace the wafer multiple times to achieve the desired position.

Accordingly, the pedestal itself may remain stationary during the image capture, position determination/measurement, and adjustment, and a pedestal configured to rotate is not required.

Referring now to FIG. 1, an example of a substrate processing system 100 for performing etching using RF plasma is shown. The substrate processing system 100 includes a processing chamber 102 that encloses other components of the substrate processing system 100 and contains the RF plasma. The substrate processing chamber 100 includes an upper electrode 104 and a pedestal 106 including a lower electrode 107. An edge coupling ring 103 is supported by the pedestal 106 and is arranged around the substrate 108. One or more actuators 105 may be used to move the edge coupling ring 103. During operation, a substrate 108 is arranged on the pedestal 106 between the upper electrode 104 and the lower electrode 107.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF voltage to one of the upper electrode 104 and the lower electrode 107. The other one of the upper electrode 104 and the lower electrode 107 may be DC grounded, AC grounded or floating. For example only, the RF generating system 110 may include an RF voltage generator 111 that generates the RF voltage that is fed by a matching and distribution network 112 to the upper electrode 104 or the lower electrode 107. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106. The heater 142 may be used to control a temperature of the pedestal 106 and the substrate 108. A valve 150 and pump 152 may be used to evacuate reactants from the processing chamber 102. A controller 160 may be used to control components of the substrate processing system 100. The controller 160 may also be used to control the actuator 105 to adjust a position of one or more portions of the edge coupling ring 103.

A robot 170 may be used to deliver substrates onto, and remove substrates from, the pedestal 106. For example, the robot 170 may transfer substrates between the pedestal 106 and a load lock 172. A camera 174 is arranged to capture an image of the substrate being transferred by the robot 170 according to the principles of the present disclosure.

Figure 2:
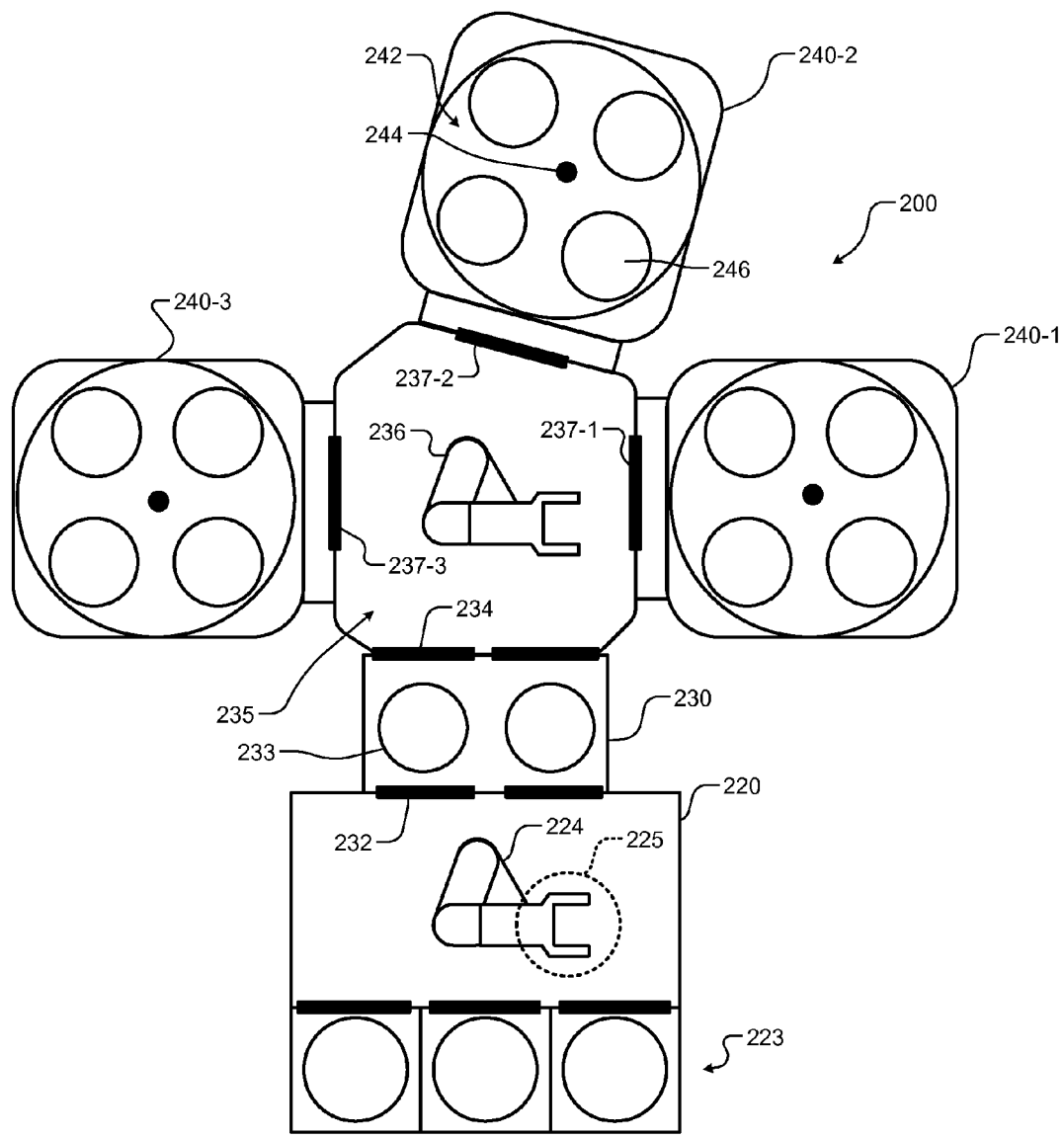
FIG. 2 is a functional block diagram of an example of substrate processing tool according to the principles of the present disclosure.

Referring now to FIG. 2, a non-limiting example substrate processing tool 200 (e.g., as implemented within the substrate processing system 100) includes a transport handling chamber 220 and multiple reactors each with one or more substrate processing chambers. A substrate 225 enters the substrate processing tool 200 from a cassette and/or pod 223, such as a front opening unified pod (FOUP). A robot 224 includes one or more end effectors to handle the substrate 225. A pressure of the transport handling chamber 220 may be at atmospheric pressure. Alternately, the transport handling chamber 220 may be at vacuum pressure (with ports acting as slot valves).

The robot 224 moves the substrates 225 from the cassette and/or pod to a load lock 230. For example, the substrate 225 enters the load lock 230 through a port 232 (or isolation valve) and is placed on a load lock pedestal 233. The port 232 to the transport handling chamber 220 closes and the load lock 230 is pumped down to an appropriate pressure for transfer. Then a port 234 opens and another robot 236 (also with one or more end effectors) in a processing handling chamber 235 places the substrates through one of the ports 237-1, 237-2, 237-3 (collectively ports 237) corresponding to a selected reactor 240-1, 240-2, and 240-3 (collectively reactors 240). Although the load lock 230 is shown having multiple pedestals and associated ports, in examples the load lock 230 may include only a single pedestal and respective ports.

A substrate indexing mechanism 242 may be used to further position the substrates relative to the substrate processing chambers. In some examples, the indexing mechanism 242 includes a spindle 244 and transfer plates 246.

In some examples, at least one of the processing chambers or stations of the reactors 240 is capable of performing semiconductor processing operations, such as a material deposition or etch, sequentially or simultaneously with the other stations. In some examples, at least one or more of the stations may perform RF-based semiconductor processing operations.

The substrate is moved from one station to the next in the reactor 240 using the substrate indexing mechanism 242. One or more of the stations of the reactors 240 may be capable of performing, for example only, RF plasma deposition, etching, or other process steps according to the specific implementation of the substrate process tool 200. During use, the substrates are moved to one or more of the reactors 240, processed and then returned. As can be appreciated, reducing the handling time of each substrate improves productivity and throughput.

The robots 224 and 236 transfer the substrates to and from the load lock 230 under the guidance of a controller (e.g., the controller 160 as shown in FIG. 1) according to the principles of the present disclosure. In particular, an image capture device is used to capture an image of each substrate (i.e., wafer) to facilitate a determination of the position (e.g., alignment) of the wafer with respect to the robot (e.g., 224 or 236) and, ultimately, the pedestal 233 of the load lock 230. Accurate determination of the position of the wafer in turn facilitates accurate capture, retrieval and transfer of the wafer (e.g., capture of the wafer by the robot 236 for transfer from the load lock 230 to the reactors 240, capture of the wafer by the robot 224 for transfer from the reactors 240 to the load lock 230, etc.).

Figure 3A:
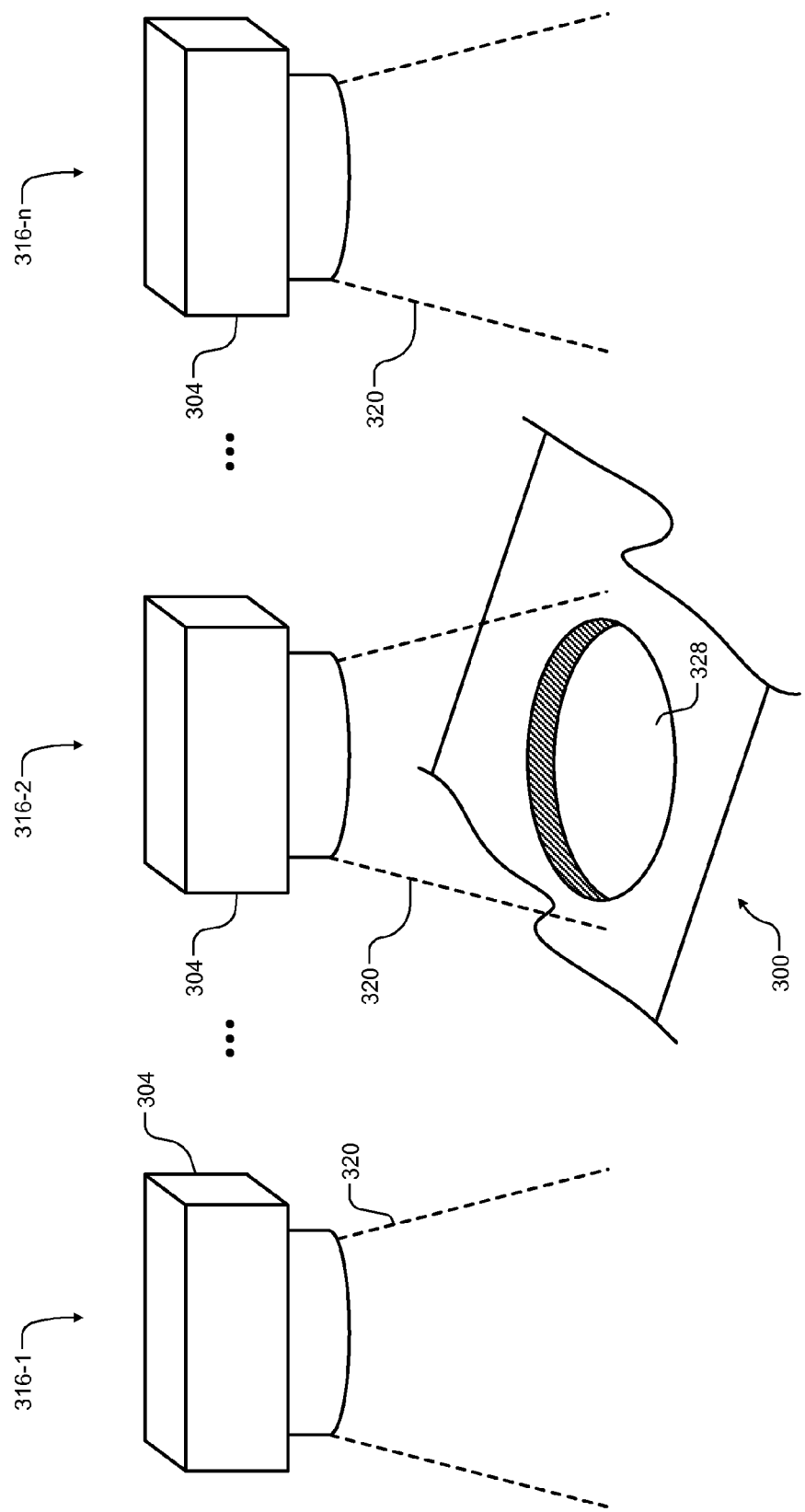
FIG. 3A illustrates example arrangements of a camera and load lock according to the principles of the present disclosure.

Referring now to FIGS. 3A, 3B, 3C, and 3D, an example portion of a load lock 300 and camera 304 are arranged to capture an image of a wafer 308 being transferred to the load lock 300 by a robot 312 according to the principles of the present disclosure. Although the configuration of the load lock 300 corresponds to the example load lock shown in FIG. 2, the load lock 300 may have other configurations. FIG. 3A illustrates the load lock 300 with the camera 304 in various example positions 316-1, 316-2, . . . , and 316-n, referred to collectively as positions 316. Position 316-2 corresponds to a position above the load lock 300 (e.g., directly above a pedestal 328 of the load lock 300). Conversely, the positions 316-1 and 316-n correspond to positions adjacent to the load lock 300 or elsewhere in and/or in the vicinity of the tool 200. For example, the positions 316-1 and 316-n correspond to positions in a path of the robot 312 in transit to and/or in transit from the load lock 300.

Figure 3B:
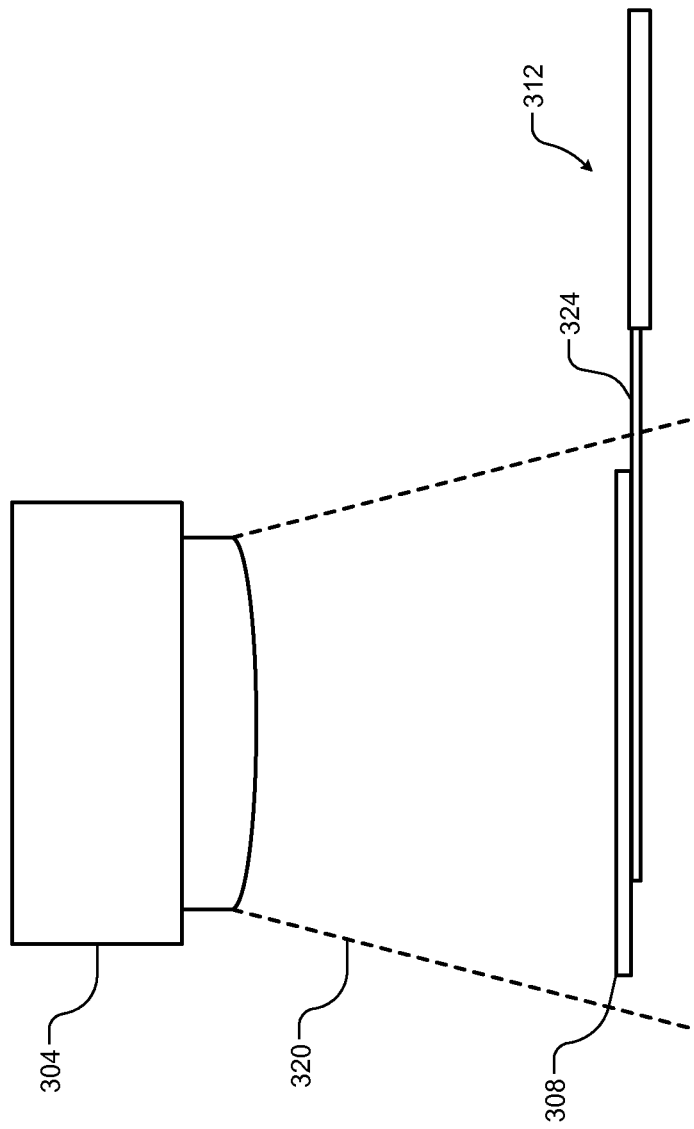
FIG. 3B is example arrangement of a camera positioned above a wafer according to the principles of the present disclosure.
Figure 3D:
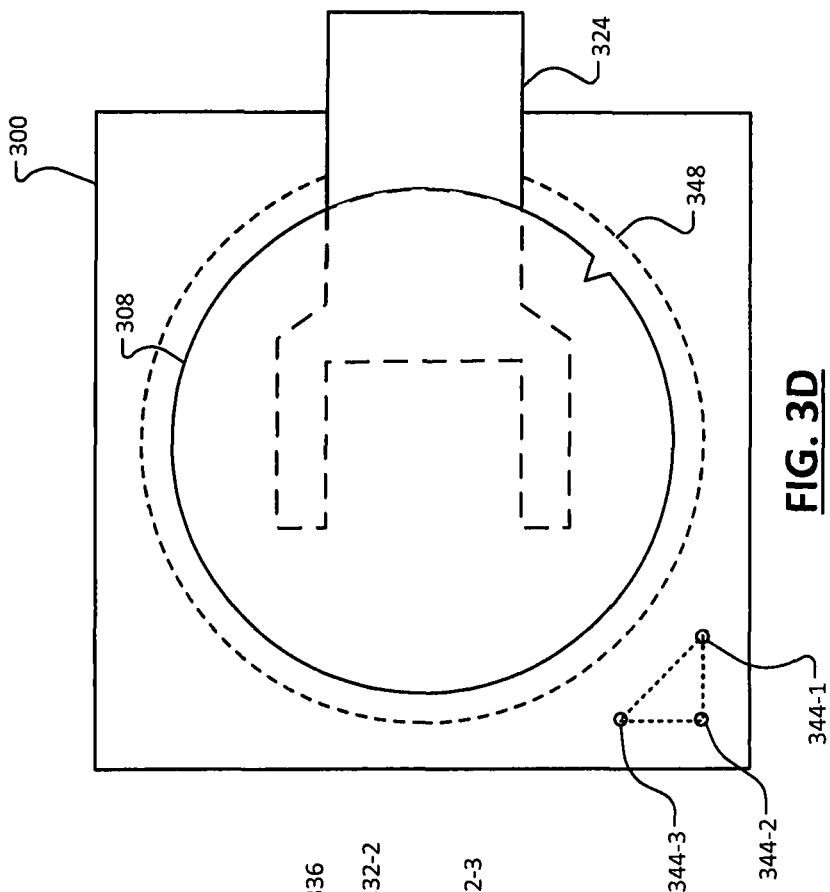
FIG. 3D illustrates example reference markings located on a load lock according to the principles of the present disclosure
Figure 3C:
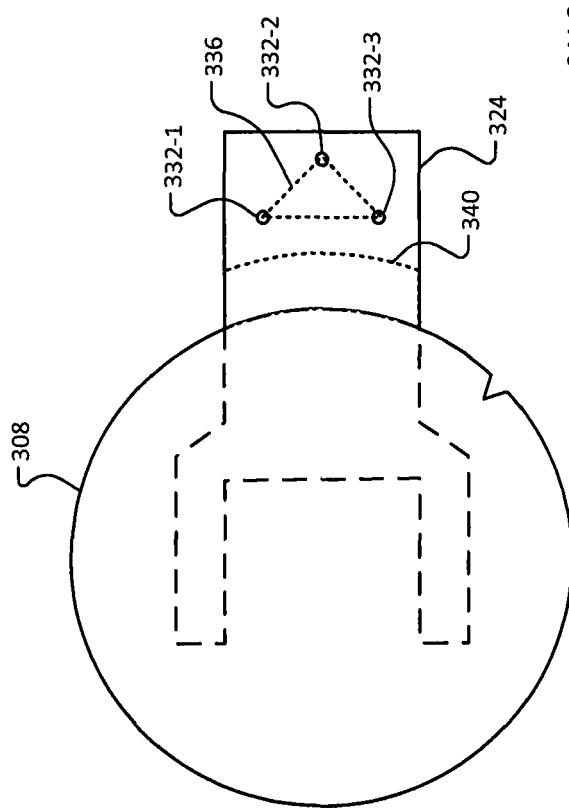
FIG. 3C illustrates example reference markings located on an end effector of a robot according to the principles of the present disclosure.

FIG. 3B illustrates a side view of the load lock 300, the camera 304, and the wafer 308 arranged in a field of view 320 of the camera 304. FIG. 3C illustrates a top down view of the wafer 308 arranged on an end effector 324 of the robot 312 in transit to or from the load lock 300. FIG. 3D illustrates a top down view of the wafer 308 arranged on the end effector 324 of the robot 312 and positioned over the load lock 300.

The wafer 308 is arranged on the end effector 324 of the robot 312 for transfer to a pedestal 328 (e.g., a cool pedestal) within the load lock 300. The camera 304 is positioned above a path of the robot 312 (e.g., with a lens of the camera 304 facing downward) to capture an image of the wafer 308. For example, the camera 304 captures an image of the wafer 308 indicating a position of the wafer 308 relative to the robot 312 (e.g., relative to the end effector 324). In examples where the camera 304 is arranged above the load lock 300, the captured image may also (or alternatively) indicate the position of the wafer 308 relative to the load lock 300 or the pedestal 328.

For example, the end effector 324 and/or the load lock 300 may include one or more reference markings. Therefore, the captured image of the wafer 308 indicates the position of the wafer 308 relative to the reference markings (e.g., both a translational or lateral position and a rotational orientation), and, accordingly, relative to the robot 312, the load lock 300, etc.

Referring now to FIG. 3C, the end effector 324 includes example reference markings 332-1, 332-2, and 332-3, referred to collectively as reference markings 332. For example only, the reference markings 332 are shown as circles or dots, but other reference markings may be used (e.g., "x," "+," etc.). As shown, the reference markings 332 are arranged in a right triangle as indicated by dashed line 336. Further, the reference markings 332 are at least two dimensional (i.e., not arranged in a single line) to define a plane. The plane defined by the reference markings 332 may be approximately coplanar with or in a plane parallel to a plane defined by the wafer 308. Although the reference markings 332 are described herein as markings arranged in a right triangle, the principles of the present disclosure may be implemented with other arrangements of reference markings, such as reference markings in any other shape having known parameters (e.g., size, shape, orientation, relative angles, etc.). In other words, as long as the parameters of the particular geometrical arrangement are known, the reference markings 332 can be used to determine the relative position of the wafer 308.

In examples, the end effector 324 may alternatively or additionally include reference markings 340. The reference markings 340 correspond to, for example, a portion of a perimeter/circumference of a circle surrounding the wafer 308. The reference markings 340 may be approximately coplanar with or in a plane parallel to the plane defined by the wafer 308.

Referring now to FIG. 3D, an embodiment where the camera 304 is positioned above the load lock 300 is shown. The load lock 300 may include reference markings 344-1, 344-2, and 344-3 (referred to collectively as reference markings 344) and/or reference markings 348 in addition to (or instead of) the reference markings 332 and/or 340 located on the end effector 324. The reference markings 344 include circles, dots, etc. arranged in a right triangle in a manner analogous to the reference markings 332. A plane defined by the reference markings 344 may be approximately coplanar with or in a plane parallel to the plane defined by the wafer 308. Conversely, the reference markings 348 correspond to, for example, a perimeter/circumference of a circle surrounding the wafer 308. The reference markings 344 and/or 348 may be approximately coplanar with or in a plane parallel to the plane defined by the wafer 308.

Accordingly, depending on the position of the camera 304, a captured image of the wafer 308 also includes the reference markings 332 and/or the reference markings 340 as shown in FIG. 3C or the reference markings 344 and/or 348 as shown in FIG. 3D. The position of the wafer 308 can then be calculated, using the captured image, by comparing features of wafer 308 in the captured image with the reference markings 332, 340, 344, and/or 348 as explained below in further detail.

Figure 4:
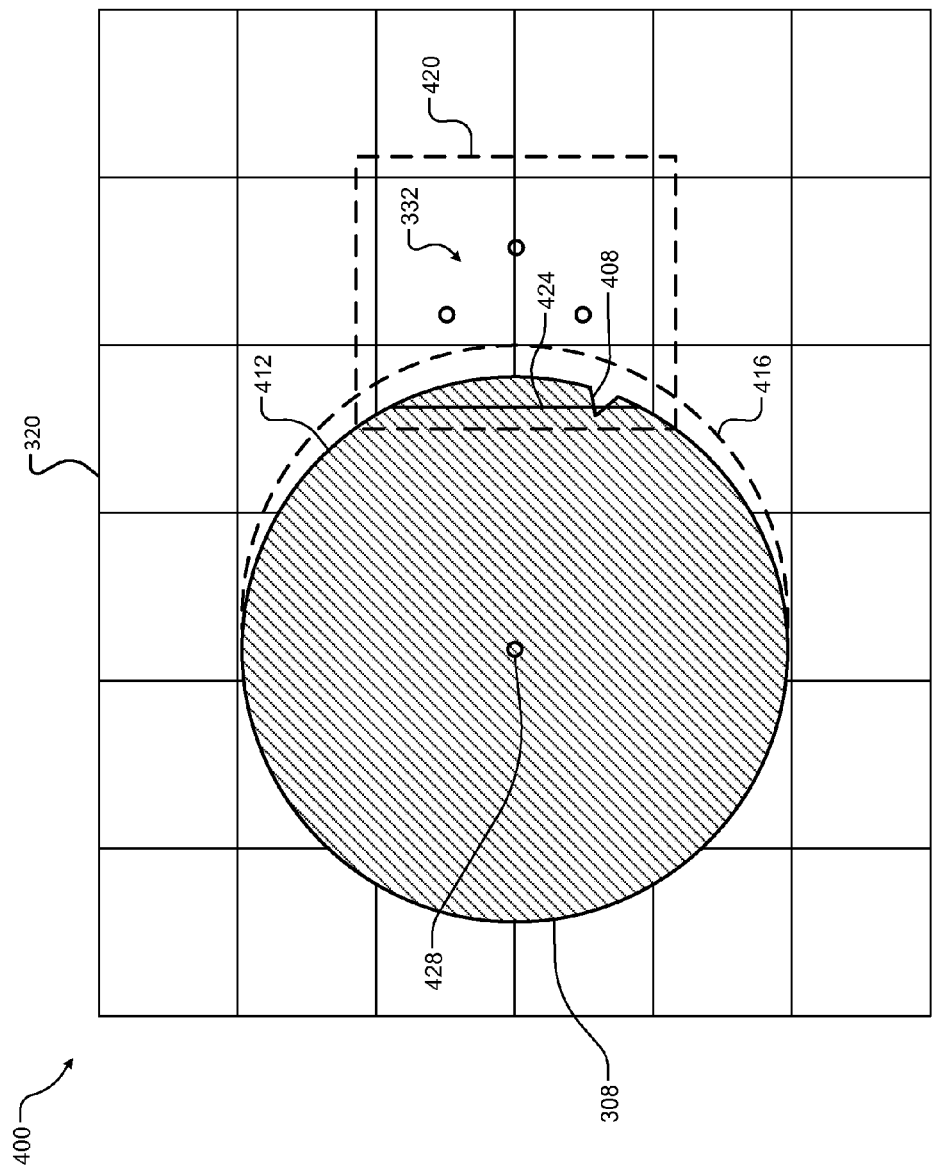
FIG. 4 is an example image of a wafer and reference markings captured according to the principles of the present disclosure.

FIG. 4 shows an example image 400 captured by the camera 304. The image 400 includes the wafer 308 within a field of view 320 of the camera 304. In examples, the wafer 308 may include a notch 408 formed in an edge of the wafer 308. The camera 304 (and/or the controller 160 shown in FIG. 1, or another device or module as described below in more detail) analyzes the captured image 400 to determine the position of the wafer 308. For example, the image 400 may also include the reference markings 332. For illustration purposes, only the reference markings 332 located on the end effector 324 of FIG. 3C are shown. However, other examples as described may include the reference markings 340, 344, and/or 348 in the captured image 400.

The camera 304 analyzes the captured image 400 to determine the position of the wafer 308 by comparing features of the wafer 308 to the reference markings 332. For example, the camera 304 may detect the edge 412 of the wafer 308 proximate the reference markings 332 and determine the position of the wafer 308 relative to the reference markings 332. In examples, the camera 304 may detect the notch 408 and determine the position of the wafer 308 further based on a position of the notch 408 relative to the reference markings 332. The determined position may include a translational position (e.g., an offset in a lateral and/or longitudinal direction) relative to the reference markings 332 and/or an orientation (e.g., a rotational position) relative to the reference markings 332. For example only, a nominal position 416 is indicated for reference.

In examples, the field of view 320 of the camera 304 may be smaller than the wafer 308 as illustrated by reduced field of view 420. However, the reduced field of view 420 still includes the edge 412 of the wafer 308, the notch 408, and the reference markings 332. Accordingly, the camera 304 is configured to analyze the captured image 400 to determine the position of the wafer 308 using features captured in the reduced field of view 420. The robot may also be configured to rotate the wafer 308 within the reduced field of view 420. The camera 304 may capture a sequence of images as the wafer 308 is rotated within the reduced field of view to capture an entire circumference of the wafer 308. For example, if the wafer 308 is positioned such that the notch 408 is not located within the reduced field of view 420 (or an insufficient portion of the edge 412 is located within the reduced field of view 420), rotating the wafer 308 with the robot allows the camera 304 to capture the features of the wafer 308 used to determine the position of the wafer 308.

In examples, the camera 304 analyzes the captured image 400 to determine a feature of the wafer 308 such as a chord line 424. For example, the camera 304 analyzes the image 400 to locate the edge 412 of the wafer 308 and calculates the position of the chord line 424 based the edge 412. The camera 304 can then calculate a center position 428 of the wafer 308 using the chord line 424 and a curvature of the edge 412. The camera 304 determines the position (translational and rotational) of the wafer 308 based on the calculated center position 428 (and, in some implementations, the notch 408) relative to the reference markings 332. Although as described in this example the chord line 424 is used to determine the center position 428, other features of the wafer 308 may be used instead of or in addition to the chord line 424 (e.g., tangent lines, a radius and/or diameter of the wafer 308, etc.).

The camera 304 may store nominal position data (e.g., data based on a position of a previously captured image of a wafer in the nominal position) and analyze the captured image 400 of the wafer 308 further based on the nominal position data. The nominal position data may include calibration data corresponding to a position of the camera 304 relative to the nominal position, including, but not limited to, a distance of the camera 304 from the nominal position (e.g., both a distance above and a lateral distance), an angle of the camera 304 relative to a plane of a wafer in the nominal position, perspective, known parameters of the reference markings 332 (e.g., distances and angles between the reference markings), etc. Accordingly, when the camera 304 analyzes the captured image 400, characteristics of an image including a wafer in the nominal position are considered in addition to the position of the wafer 308 and the reference markings 332 to accurately determine the position of the wafer 308 and required adjustments to the position of the wafer 308.

Further, because the parameters of the particular arrangement of the reference markings 332 are known, it is not necessary for an image sensor (e.g., a lens) of the camera 304 to be arranged on a plane that is parallel to the plane of the wafer 308. For example, skew (i.e., discrepancies in perspective, scale, etc. caused by the position of the camera 304 relative to the wafer 308) in the reference markings 332 in the captured image can be compared to the known parameters of the reference markings 332. The camera 304 can then compensate this skew when calculating the position of the wafer 308.

Figure 5:
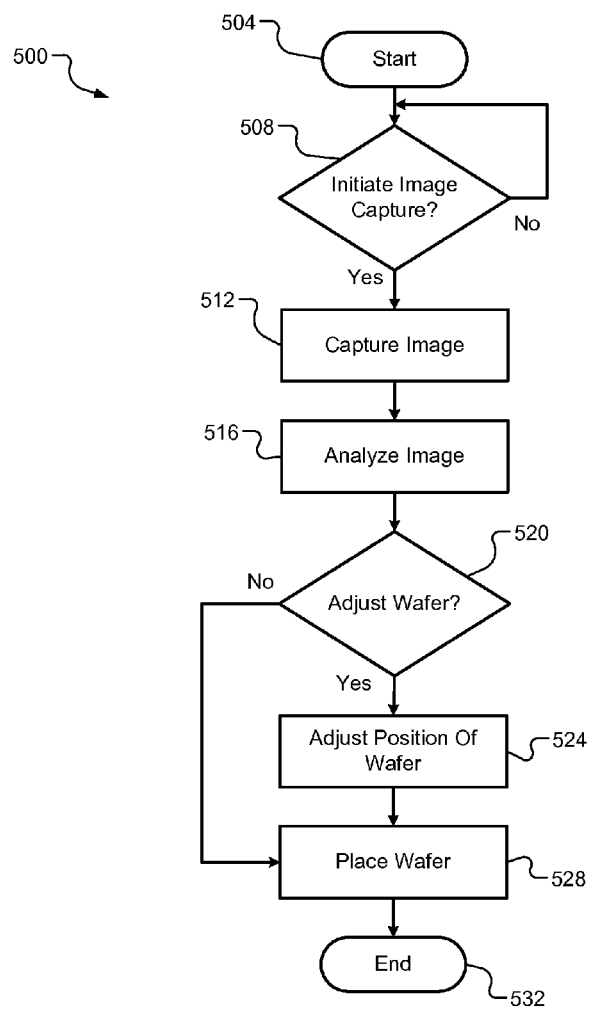
FIG. 5 illustrates steps of an example wafer alignment method according to the principles of the present disclosure.

Referring now to FIG. 5, an example wafer alignment method 500 according to the principles of the present disclosure begins at 504. The method 500 is implemented using various components of FIGS. 1-4 as described below. At 508, the method 500 determines whether to initiate an image capture of a wafer. For example, a camera (or other controller, module, etc.) may receive information indicating a position of a robot transporting the wafer to or from a load lock or other structure. If true, the method 500 continues to 512. If false, the method 500 continues to 508 to again determine whether to initiate the image capture.

The adjustments are provided to a system control module 624 of the controller 608. Although shown as a single module, the system control module 624 may represent one or more modules related to control of a substrate processing system, such as control of plating robots, control of plating cell load positions, etc. For the purposes of the present example, the system control module 624 controls the robot to place the wafer to and retrieve the wafer from the load lock, place the wafer on a process cell, etc. The system control module 624 uses the adjustment data to control the robot to place the wafer on the pedestal, adjust the robot, retrieve the wafer, one or more times, until the wafer is in the nominal position on the robot as described above in FIG. 5.

At 512, the camera captures an image of the wafer positioned on the robot. At 516, the camera analyzes the image to determine a position of the wafer relative to the robot. For example, the camera detects one or more features of the wafer (e.g., an edge, a notch, a chord line, a center position, etc.), reference markings on the robot and/or the load lock, and/or nominal position data corresponding to a previously captured image of a wafer in a nominal position to determine the position of the wafer.

At 520, the camera determines whether to adjust the position of the wafer. For example, the camera may determine whether an adjustment of the wafer is necessary. In examples, the camera determines whether a difference between the position of the wafer and the nominal position is greater than one or more thresholds (e.g., a translational displacement threshold, a rotational displacement threshold, etc.). If the difference is greater than any of the thresholds, then the camera determines that adjustment is necessary and continues to 524. If the difference is less than the thresholds, then the camera may determine that no adjustment is necessary and continues to 528 and a next substrate processing step (e.g., placing the wafer on the load lock, transferring wafer to a processing chamber, etc.).

At 524, the position of the wafer on the robot is adjusted. For example, a position of the robot may be adjusted, based on the calculated difference between the position of the wafer and the nominal position, prior to and/or subsequent to placing the wafer (e.g., to a pedestal of the load lock, etc.). In one example, the position of the robot is adjusted, based on the position of the wafer relative to the reference markings, prior to placing the wafer on the pedestal. For example, a first position of the robot may correspond to a default approach or position of the robot relative to a destination of the wafer. In particular, the first position may correspond to an approach to the destination of the wafer when the wafer is in the nominal position on the robot. The robot may be adjusted to a second position offset from the first position based on the difference between the actual determined position of the wafer and the nominal position as described above. Consequently, when the robot places the wafer to the pedestal from the adjusted second position, the wafer may be placed in a nominal position on the pedestal.

In another example, the robot places the wafer on the pedestal prior to making any adjustments and then the position of the robot is adjusted, based on the determined position of the wafer relative to the reference markings, prior to retrieving the wafer from the pedestal. In other words, the wafer is placed on the pedestal in a non-nominal position, and the robot is then adjusted so that when the wafer is retrieved by the robot, the wafer is in the nominal position on the robot. The robot then places the wafer in the nominal position on the pedestal.

The method 500 may repeat the process of adjusting a position of the robot, retrieving the wafer, and returning the wafer to the pedestal to perform further adjustments of the position of the wafer. For example only, the robot may retrieve the wafer and return to a location corresponding to the camera to trigger the camera to capture another image of the wafer, and the robot can be controlled to retrieve and replace the wafer multiple times to achieve the desired position. When the wafer is in the desired position on the robot, the wafer is placed to the pedestal, process cell, etc. at 528. The method ends at 532.

Figure 6:
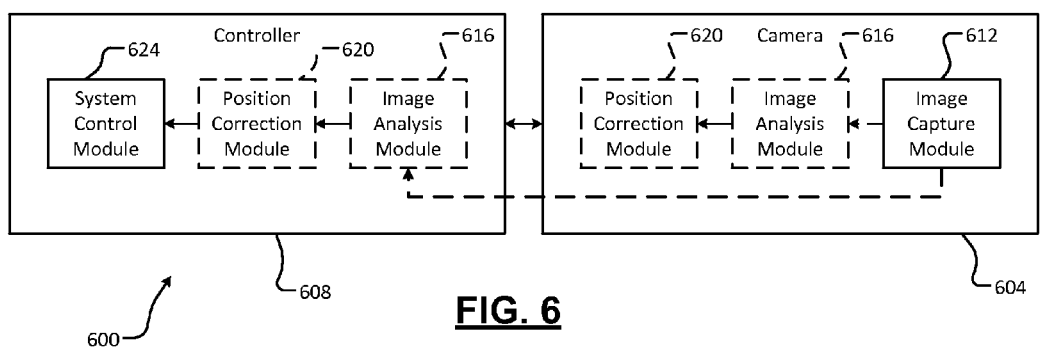
FIG. 6 is a functional block diagram of an example wafer alignment system according to the principles of the present disclosure.

Referring now to FIG. 6, a simplified example wafer alignment system 600 according to the principles of the present disclosure is shown. The wafer alignment system 600 includes a camera 604 and a controller 608 (corresponding to, for example only, the camera 304 and the controller 160). The camera 604 includes an image capture module 612 and optionally includes an image analysis module 616 and position correction module 620. The image capture module 612 controls the capture of an image of a wafer positioned on a robot as described in FIGS. 1-5. For example, the image capture module 612 is responsive to a command from the controller 608 to initiate the capture of the image of the wafer when the robot is in a position corresponding to a location of the camera (e.g., when the wafer is within a field of view of the camera).

The image capture module 612 provides the captured image to the image analysis module 616. As shown, the image analysis module 616 may be located in the camera 604 and/or the controller 608. The image analysis module 616 analyzes the image to determine the position of the wafer on the robot relative to the reference markings. For example, the image analysis module 616 locates the reference markings, an edge of the wafer, and/or a notch in the edge of the wafer, calculates positions of various features of the wafer (e.g., a chord line, a center position, etc.), and determines the position of the wafer accordingly as described above in FIGS. 1-5. The image analysis module 616 provides the determined position of the wafer to the position correction module 620, which calculates corrective adjustments (i.e., adjustment data) to the position of the robot based on the determined position (e.g., based on the determined position and a nominal position). As shown, the position correction module 620 may be located in the camera 604 and/or the controller 608.

The adjustments are provided to a system control module 624 of the controller 608. Although shown as a single module, the system control module 624 may represent one or more modules related to control of a substrate processing system, such as control of plating robots, control of plating cell load positions, etc. For the purposes of the present example, the system control module 624 controls the robot to place the wafer to and retrieve the wafer from the load lock, place the wafer on a process cell, etc. The system control module 624 uses the adjustment data to control the robot to place the wafer on the pedestal, adjust the robot, retrieve the wafer, one or more times, until the wafer is in the nominal position on the robot as described above in FIG. 5.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'controller' may be replaced with the term 'circuit.' The term 'controller' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The controller may include one or more interface circuits. In some examples, the interface circuits may include wired or wireless interfaces that are connected to a local area network (LAN), the Internet, a wide area network (WAN), or combinations thereof. The functionality of any given controller of the present disclosure may be distributed among multiple controllers that are connected via interface circuits. For example, multiple controllers may allow load balancing. In a further example, a server (also known as remote, or cloud) controller may accomplish some functionality on behalf of a client controller.

The term code, as used above, may include software, firmware, and/or microcode, and may refer to programs, routines, functions, classes, data structures, and/or objects. The term shared processor circuit encompasses a single processor circuit that executes some or all code from multiple controllers. The term group processor circuit encompasses a processor circuit that, in combination with additional processor circuits, executes some or all code from one or more controllers. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple controllers. The term group memory circuit encompasses a memory circuit that, in combination with additional memories, stores some or all code from one or more controllers.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some examples, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A wafer alignment system comprising:
   an image capture module that captures an image of a wafer positioned on a robot;
   an image analysis module that analyzes the image to determine a position of the wafer on the robot while the wafer is positioned on the robot, wherein the determined position includes both a lateral position of the wafer relative to the robot and a rotational position of the wafer relative to the robot, and wherein the rotational position of the wafer corresponds to rotation of the wafer on an axis defined by a center of the wafer,
   wherein the robot includes reference markings for determining the rotational position of the wafer relative to the robot, wherein the reference markings are in a non-linear arrangement on the robot, and wherein the image analysis module locates the reference markings and determines the rotational position of the wafer relative to the robot in accordance with (i) parameters of the non-linear arrangement of the reference markings and (ii) one or more features of the wafer;
   a position correction module that calculates adjustment data based on the determined position of the wafer on the robot, wherein the adjustment data corresponds to respective adjustments to the lateral position of the wafer relative to the robot and the rotational position of the wafer relative to the robot; and
   a system control module that controls the robot to at least one of place the wafer and retrieve the wafer based on the calculated adjustment data and a nominal wafer position on the robot.

2. The wafer alignment system of claim 1, wherein the image capture module is arranged in a location along a path of the robot from a retrieval location of the wafer to a destination of the wafer.

3. The wafer alignment system of claim 1, wherein the image capture module is located above a pedestal of a load lock.

4. The wafer alignment system of claim 1, wherein, to capture the image of the wafer, the image capture module captures the image of the wafer in response to an indication that the robot is in a predetermined position.

5. The wafer alignment system of claim 1, wherein the reference markings include at least three markings.

6. The wafer alignment system of claim 5, wherein the at least three markings are arranged in a triangle.

7. The wafer alignment system of claim 1, wherein the one or more features of the wafer include at least one of an edge of the wafer, a notch formed in the edge of the wafer, and the center of the wafer.

8. The wafer alignment system of claim 1, wherein, to calculate the adjustment data, the position correction module calculates the adjustment data further based on the nominal wafer position on the robot.

9. The wafer alignment system of claim 1, wherein the one or more features of the wafer include a chord line of the wafer.

10. The wafer alignment system of claim 1, wherein the parameters include an angle of the non-linear arrangement of the reference markings.

11. A wafer alignment method comprising:
    capturing an image of a wafer positioned on a robot while the wafer is positioned on the robot;
    analyzing the image to determine a position of the wafer on the robot, wherein the determined position includes both a lateral position of the wafer relative to the robot and a rotational position of the wafer relative to the robot, and wherein the rotational position of the wafer corresponds to rotation of the wafer on an axis defined by a center of the wafer,
    wherein the robot includes reference markings for determining the rotational position of the wafer relative to the robot, wherein the reference markings are in a non-linear arrangement on the robot, and wherein analyzing the image includes locating the reference markings and determining the rotational position of the wafer relative to the robot in accordance with (i) parameters of the non-linear arrangement of the reference markings and (ii) one or more features of the wafer;
    calculating adjustment data based on the determined position of the wafer on the robot, wherein the adjustment data corresponds to respective adjustments to the lateral position of the wafer relative to the robot and the rotational position of the wafer relative to the robot; and
    controlling the robot to at least one of place the wafer and retrieve the wafer based on the calculated adjustment data and a nominal wafer position on the robot.

12. The wafer alignment method of claim 11, wherein capturing the image of the wafer includes capturing the image of the wafer from a location along a path of the robot from a retrieval location of the wafer to a destination of the wafer.

13. The wafer alignment method of claim 11, wherein capturing the image of the wafer includes capturing the image of the wafer from a location above a pedestal of a load lock.

14. The wafer alignment method of claim 11, wherein capturing the image of the wafer includes capturing the image of the wafer in response to an indication that the robot is in a predetermined position.

15. The wafer alignment method of claim 11, wherein the reference markings include at least three markings.

16. The wafer alignment method of claim 15, wherein the at least three markings are arranged in a triangle.

17. The wafer alignment method of claim 11, wherein the one or more features of the wafer include at least one of an edge of the wafer, a notch formed in the edge of the wafer, and the center of the wafer.

18. The wafer alignment method of claim 11, wherein calculating the adjustment data includes calculating the adjustment data further based on the nominal wafer position on the robot.

19. The method of claim 11, wherein the one or more features of the wafer include a chord line of the wafer.

20. The method of claim 11, wherein the parameters include an angle of the non-linear arrangement of the reference markings.

\* \* \* \* \*